(12) United States Patent
Girard et al.

(10) Patent No.: US 7,026,720 B2
(45) Date of Patent: Apr. 11, 2006

(54) FLIP-CHIP MOUNTED INTEGRATED CIRCUIT CARD ELEMENT

(75) Inventors: Sophie Girard, Montrouge (FR); Stéphane Provost, Montrouge (FR)

(73) Assignee: Schlumberger Inc., (US)

( * ) Notice: Subject to any disclaimer, the term of this patent is extended or adjusted under 35 U.S.C. 154(b) by 97 days.

(21) Appl. No.: 10/169,525

(22) PCT Filed: Dec. 13, 2000

(86) PCT No.: PCT/FR00/03500

§ 371 (c)(1),
(2), (4) Date: Sep. 9, 2003

(87) PCT Pub. No.: WO01/50415

PCT Pub. Date: Jul. 12, 2001

(65) Prior Publication Data

US 2004/0036178 A1  Feb. 26, 2004

(30) Foreign Application Priority Data

Dec. 30, 1999 (FR) ................................. 99 16736

(51) Int. Cl.
H01L 23/48 (2006.01)

(52) U.S. Cl. ............... 257/778; 257/684; 257/737; 257/787; 438/112; 438/124; 438/127; 361/728; 361/737

(58) Field of Classification Search ............... 257/679, 257/684, 737, 773, 778, 787; 438/112, 124, 438/127; 361/728, 737

See application file for complete search history.

(56) References Cited

U.S. PATENT DOCUMENTS

| 5,528,222 | A | 6/1996 | Moskowitz et al. |
| 5,682,296 | A | 10/1997 | Horejs, Jr. et al. |
| 6,111,303 | A * | 8/2000 | Launay .................. 257/531 |
| 6,435,415 | B1 | 8/2002 | Catte |

* cited by examiner

*Primary Examiner*—Donghee Kang
(74) *Attorney, Agent, or Firm*—Anderson & Jansson; Pehr Jansson

(57) ABSTRACT

The invention relates to an integrated circuit card element, comprising a support (1) on which an electrical circuit (2) is produced, an integrated circuit (5) being connected thereto and having an active flip-chip mounted surface (7), said integrated circuit (5) being fixed to the support by a sealing product (6) that is arranged between the active surface of the integrated circuit and the support. The inventive element comprises a reinforcement segment (8) which is fixed on an inactive surface (9) of the integrated circuit opposite the active surface (7).

5 Claims, 1 Drawing Sheet

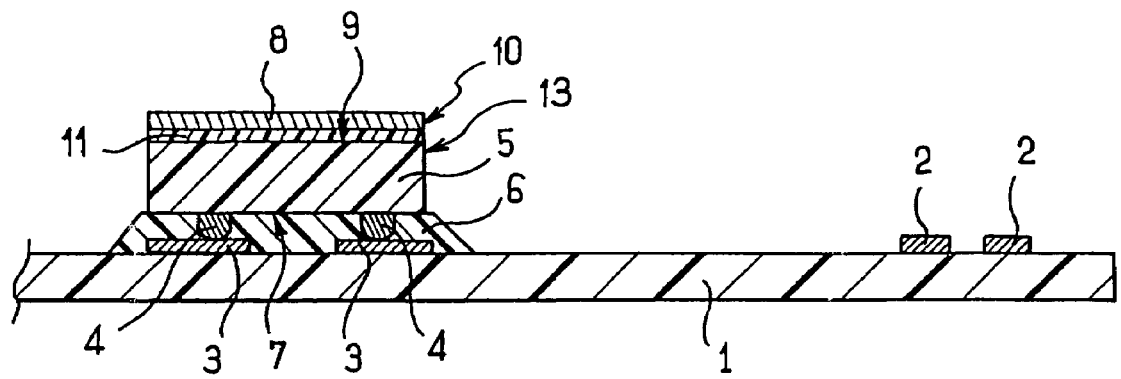
FIG_1
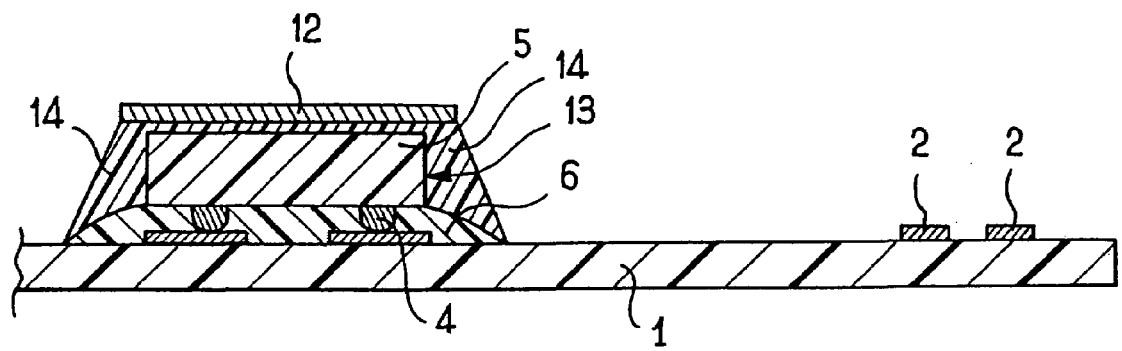
FIG_2
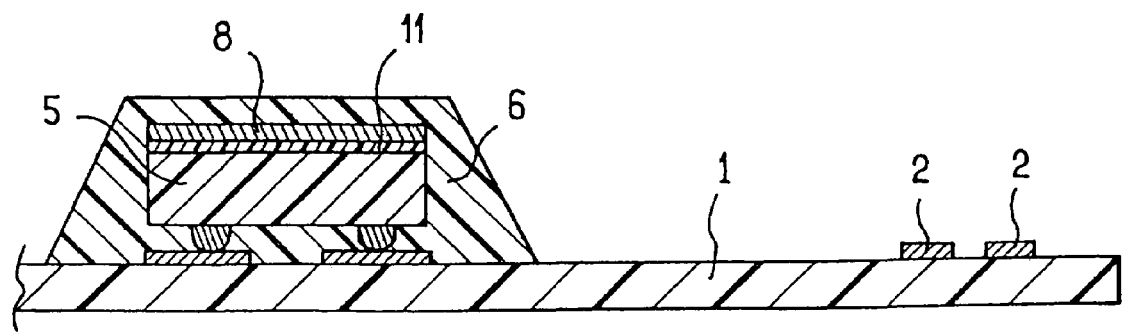
FIG_3

FLIP-CHIP MOUNTED INTEGRATED CIRCUIT CARD ELEMENT

FIELD OF THE INVENTION

This invention concerns a card element with integrated circuit mounted using the flip-chip technique.

BACKGROUND OF THE INVENTION

Due to the ever increasing development of applications using an integrated circuit, more and more card elements including an integrated circuit need to be produced. In order to satisfy the demand, a method is required which enables an integrated circuit to be attached extremely quickly onto a card element. The flip-chip technique is therefore used, in which the active face of the integrated circuit with the connection terminals of the integrated circuit is applied directly on the terminals of an electrical circuit produced beforehand on a support. In addition, the integrated circuit is attached on the support by a sealing resin applied between the active face of the integrated circuit and the support.

"The patent U.S. Pat. No. 5,682,296 concerns a card including an integrated circuit module into which a reinforcement element is introduced, surrounding the module in order to protect it. The reinforcement element is inserted in one or more layers of the card. The reinforcement element reduces the forces applied to the integrated circuit during flexions and torsions of the card. Nevertheless, this type of reinforcement element does not protect the active side of the integrated circuit, especially during the manufacturing process".

In the current manufacturing techniques, card elements, especially when the card element is intended to form part of a card used in an electronic terminal, whether a contact card or a contactless card, the support of the integrated circuit is generally thin or flexible resulting in a risk of damage to the integrated circuit when the card element is subject to mechanical stress, for example bending or torsion stress. The various treatments and the various handling operations applied to the integrated circuit during manufacture and positioning on the card element are likely to create in the inactive side of the integrated circuit, opposite the active side, incipient breaks which reduce the bending strength of the integrated circuit.

SUMMARY OF THE INVENTION

To overcome this disadvantage, the invention proposes a card element "with an integrated circuit, the card element including a support with an electrical circuit to which is associated to the integrated circuit which has an active side, the integrated circuit being mounted using the flip-chip technique, the integrated circuit being bonded to the support by a sealing product applied between the active side of the integrated circuit and the support, the card element including in addition a reinforcement dish, wherein the reinforcement disc is bonded on an inactive side of the integrated circuit opposite the active side."

Consequently, the reinforcement disc not only increases the mechanical strength of the inactive side of the integrated circuit but above all it displaces the neutral fibre of the card element towards the reinforcement disc so that the inactive side of the integrated circuit is subject to lower stress in traction or compression when the card element is bent. The risk of breaking the integrated circuit is therefore doubly reduced.

According to an advantageous version of the invention, the sealing product surrounds the integrated circuit and is therefore preferably in contact with an edge of the reinforcement disc. The sealing product therefore encases the integrated circuit and the reinforcement disc.

According to another advantageous version of the invention, the sealing product covers the reinforcement disc. The integrated circuit and the reinforcement disc are therefore encapsulated in the sealing product.

BRIEF DESCRIPTION OF THE DRAWINGS

Other features and advantages of the invention will appear on reading the description which follows of three special, non-limiting modes of realisation of the card element with integrated circuit according to the invention, in reference to the attached figures, amongst which:

FIG. 1 is a cross section of part of a contactless card element according to a first mode of realisation of the invention, FIG. 2 is a cross section similar to that of FIG. 1 according to a second mode of realisation of the invention, FIG. 3 is a cross section similar to that of FIG. 1 according to a third mode of realisation of the invention.

DETAILED DESCRIPTION

In reference to FIG. 1, the card element with integrated circuit according to the invention includes in a known manner a support 1, for example a sheet of thermoplastic material on which an electrical circuit 2 has been produced, in this case an antenna circuit of which only two turns are represented on the figure. The electrical circuit 2 includes terminals 3 to which are connected the contact studs 4 of an integrated circuit 5 attached to the support 1 by a sealing resin 6 applied between the active side 7 of the integrated circuit and the part opposite the support 1.

According to the invention, a reinforcement disc 8 is attached on the inactive side 9 of the integrated circuit. The reinforcement disc 8 can be made from any suitable material to provide a reinforcement corresponding to the type of the integrated circuit and to the use of the card element. In particular, the reinforcement disc can be made from a composite material, plastic material or metal as illustrated. Its structure can be homogeneous or heterogeneous. In this mode of realisation, the disc is positioned by placing a reinforcement sheet on a wafer of integrated circuits then the wafer and reinforcement sheet are cut simultaneously so that the edge 10 of the reinforcement disc 8 is vertically above the lateral surface 13 of the integrated circuit 5.

The method used to bond the reinforcement disc to the inactive side of the integrated circuit may be the same as that used to seal the integrated circuit on the support. In particular, an adhesive or a resin 11 can be applied hot or cold on the disc and/or on the inactive side of the integrated circuit and optionally a heat or cold activated adhesive or resin can be used.

The thickness and type of the disc and the thickness and type of the resin or adhesive 11 bonding the disc 8 onto the integrated circuit 5 are chosen according to the application to obtain a suitable displacement of the neutral fibre of the constraints when the card element is bent.

In the second mode of realisation illustrated on FIG. 2, the integrated circuit is mounted using the same method as before but the reinforcement disc 12 is larger than the upper side of the integrated circuit 6 and is bonded to it after mounting the integrated circuit 5 on the support 1. To bond the reinforcement disc 12, a drop of resin 14, for example, is deposited on the upper side of the integrated circuit then the reinforcement disc 12 is applied. The resin 14 spreads between the disc 12 and the upper side of the integrated circuit 5 and runs over its sides to join with the sealing resin 6. The lateral surface 13 of the integrated circuit is therefore underneath the reinforcement disc 12 and surrounded by the resin 14 so that the bonding of the disc 12 is stronger than with the first mode of realisation.

In the third mode of realisation illustrated on FIG. 3, the sealing resin 6 covers the reinforcement disc 8 so that the integrated circuit 5 and the reinforcement disc 8 are encapsulated in the sealing resin. In this mode of realisation, the sealing resin could also be deposited so as to simply surround the integrated circuit without covering it whilst coming into contact with the edge 10 of the reinforcement disc so that the integrated circuit 5 and the reinforcement disc 8 are encased in the sealing resin 6.

The invention is of course not limited to the modes of realisation described and variants could be found by those skilled in the art without leaving the scope of the invention as defined by the claims.

In particular, although the reinforcement disc has been represented with an edge 10 vertically above the lateral surface of the integrated circuit or projecting over it, a reinforcement disc could be designed whose edge 10 is set back from the lateral side of the integrated circuit 5 or whose shape is not the same as that of the integrated circuit.

Depending on how the card element with integrated circuit according to the invention will be used, variations can be made to the thickness of the reinforcement disc, the type of material it is made from or the thickness of the bonding resin between the inactive side of the integrated circuit and the reinforcement disc.

Although the invention has been described for a contactless card element, it could also be implemented on a card element which would be integrated in a card with contact.

Although the invention has been described for a sealing resin deposited around the integrated circuit after it has been positioned on the support, the invention could also be implemented with another sealing product, for example a film of material which can be reactivated containing electroconductive particles which make it electrically anisotropic and make the sealing product conducting, vertically above the terminals of the integrated circuit. The sealing product is then applied to the active side of the integrated circuit before the latter is placed on the support, or even before cutting the silicon wafer from which the integrated circuit is initially produced.

The invention claimed is:

1. A card element with an integrated circuit, the card element including a support with an electrical circuit to which is associated the integrated circuit which has an active side, the integrated circuit being mounted using the flip-chip technique, the integrated circuit being bonded to the support by a sealing product applied between the active side of the integrated circuit and the support, the card element including in addition a reinforcement disc, wherein the reinforcement disc is bonded to an inactive side of the integrated circuit opposite the active side.

2. The card element according to claim 1, wherein the sealing product surrounds the integrated circuit.

3. The card element according to claim 2, wherein the sealing product is in contact with an edge of the reinforcement disc.

4. The card element according to claim 3, wherein the sealing product covers the reinforcement disc.

5. The card element according to claim 1, wherein the integrated circuit has a lateral side which is underneath the reinforcement disc and wherein the reinforcement disc is bonded by a resin spread between the reinforcement disc and the inactive side of the integrated circuit and running over the lateral side.

\* \* \* \* \*